US009094031B2

United States Patent
Lo et al.

(10) Patent No.: US 9,094,031 B2
(45) Date of Patent: Jul. 28, 2015

(54) DRIVING CIRCUIT AND DATA TRANSMITTING METHOD

(71) Applicant: Raydium Semiconductor Corporation, Hsinchu (TW)

(72) Inventors: Yu-Lung Lo, New Taipei (TW); Kuan-Hung Chou, Kaohsiung (TW); Chien-Ming Chen, Tainan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 14/321,470

(22) Filed: Jul. 1, 2014

(65) Prior Publication Data
US 2015/0009057 A1    Jan. 8, 2015

(30) Foreign Application Priority Data
Jul. 5, 2013   (TW) .............................. 102124220 A

(51) Int. Cl.
*H03M 1/66*   (2006.01)
*H03M 1/00*   (2006.01)
*H03M 1/06*   (2006.01)

(52) U.S. Cl.
CPC ................ *H03M 1/002* (2013.01); *H03M 1/06* (2013.01); *H03M 1/66* (2013.01)

(58) Field of Classification Search
CPC ..... G09G 3/20; G09G 3/3688; G09G 3/3685; G09G 3/3614; G09G 3/3648; G09G 5/00; H03M 1/06; H03M 1/002; H03M 1/66; H03K 17/06; H03F 3/45179; G11B 7/126
USPC ..................... 345/212, 92, 204, 87; 330/253; 327/108; 341/140–155

See application file for complete search history.

(56) References Cited

U.S. PATENT DOCUMENTS 6,567,062 B1 * 5/2003 Kudo et al. ..................... 345/89
2011/0317536 A1 * 12/2011 Cha et al. ..................... 369/100

* cited by examiner

*Primary Examiner* — Lam T Mai

(57) ABSTRACT

A driving circuit includes channels, a positive converting unit, a negative converting unit, an input switch, and an operational amplifier. A first digital data and a second digital data are alternatively transmitted in a first channel and a second channel. The positive converting unit and negative converting unit are respectively disposed in first channel and second channel and convert first digital data and second digital data into a positive analog data and a negative analog data. A first input terminal and a second input terminal of operational amplifier are respectively in first channel and second channel. After input switch respectively transmits positive analog data and negative analog data to first input terminal and second input terminal or to second input terminal and first input terminal, positive analog data and negative analog data are transmitted in a channel of the channels corresponding to entering operational amplifier.

15 Claims, 9 Drawing Sheets

DRIVING CIRCUIT AND DATA TRANSMITTING METHOD

BACKGROUND OF THE INVENTION

1. Field of the Invention

This invention relates to a driving circuit, especially to a driving circuit and a data transmitting method capable of reducing cost and power consumption.

2. Description of the Related Art

A conventional display apparatus includes front-end circuits and back-end circuits. The front-end circuits is used to process digital data, and the back-end circuits is used to convert the digital data into analog data and provide the analog data for the display panel to display images. In normal conditions, the operational voltage of digital data is a low voltage ranging from 2.5V to 3.5V, while the operational voltage of analog data is a high voltage ranging from 0 to 16V. In practical applications, the conventional display apparatus uses the back-end circuits to convert the digital data.

When the R & D personnel designs the back-end circuits, high impedance switches are disposed in each channel. In fact, the high impedance switches are disposed at output terminals of the operational amplifiers to switch the analog data to specific channel. However, the high impedance switches will cause high power consumption and the temperature of the circuits will be increased. In addition, since the high impedance switches have their volumes, it is hard to reduce the entire volume of the conventional display apparatus having the high impedance switches.

SUMMARY OF THE INVENTION

Therefore, the invention provides to a driving circuit and a data transmitting method to solve the above-mentioned problems.

A scope of the invention is to provide a driving circuit using different control signals to control the transmission of analog data.

Another scope of the invention is to provide a driving circuit having reduced number of switch to reduce cost.

Another scope of the invention is to provide a data transmitting method to control the transmitting path of the analog data.

An embodiment of the invention is a driving circuit. In this embodiment, the driving circuit includes a plurality of channels, a positive converting unit, a negative converting unit, an input switch, and an operational amplifying module. The plurality of channels includes a first channel and a second channel. A first digital data and a second digital data are alternatively transmitted in the first channel and the second channel. The positive converting unit is disposed in the first channel and used for converting the first digital data into a positive analog data. The negative converting unit is disposed in the second channel and used for converting the second digital data into a negative analog data. The input switch is coupled to the positive converting unit and the negative converting unit. The operational amplifying module is coupled to the input switch. A first input terminal and a second input terminal of the operational amplifying module are disposed in the first channel and the second channel respectively.

In an embodiment, the operational amplifying module includes a first operating unit and a second operating unit. The first operating unit is coupled to the first input terminal and disposed in the first channel and used for receiving the positive analog data or the negative analog data from the first input terminal. The second operating unit is coupled to the second input terminal and disposed in the second channel and used for receiving the positive analog data or the negative analog data from the second input terminal.

In an embodiment, the first operating unit includes a first positive output unit and a first negative output unit. The first positive output unit is coupled to the first input terminal and used for receiving the positive analog data transmitted by the first input terminal according to a positive output control signal. The first negative output unit is coupled to the first input terminal and used for receiving the negative analog data transmitted by the first input terminal according to a negative output control signal. The operational voltage of the first positive output unit is twice as the operational voltage of the first negative output unit.

In an embodiment, the second operating unit includes a second positive output unit and a second negative output unit. The second positive output unit is coupled to the second input terminal and for receiving the positive analog data transmitted by the second input terminal according to a positive output control signal. The second negative output unit is coupled to the second input terminal and used for receiving the negative analog data transmitted by the second input terminal according to a negative output control signal. The operational voltage of the second positive output unit is twice as the operational voltage of the second negative output unit.

In an embodiment, the driving circuit further includes a control module. The control module is coupled to the input switch and the operational amplifying module and used for outputting a plurality of control signals to the input switch and the operational amplifying module. The plurality of control signals includes the switch control signal, the positive output control signal, and the negative output control signal.

In an embodiment, the switch control signal includes a first switch control signal. When the positive converting unit converts the first digital data into a first positive analog data, the input switch transmits the first positive analog data to the first input terminal according to the first switch control signal.

In an embodiment, the switch control signal further includes a second switch control signal. When the positive converting unit converts the second digital data into a second positive analog data, the input switch transmits the second positive analog data to the second input terminal according to the second switch control signal.

In an embodiment, when the negative converting unit converts the first digital data into a first negative analog data, the input switch transmits the first negative analog data to the first input terminal according to the second switch control signal.

In an embodiment, when the negative converting unit converts the second digital data into a second negative analog data, the input switch transmits the second negative analog data to the second input terminal according to the first switch control signal.

Another embodiment of the invention is a data transmitting method. In this embodiment, the data transmitting method includes steps of: (a) transmitting a first positive analog data and a second negative analog data from a positive converting unit and a negative converting unit to a first input terminal and a second input terminal of an operational amplifying module respectively according to a first switch control signal, wherein the positive converting unit and the first input terminal are disposed in a first channel and the negative converting unit and the second input terminal are disposed in a second channel; and (b) transmitting a second positive analog data and a first negative analog data from the positive converting unit and the negative converting unit to the second input terminal and the first input terminal respectively according to a second switch control signal.

Compared to the prior art, the driving circuit and data transmitting method of the invention use control signals to control the transmitting path of the analog data to simplify the structure of back-end circuit, so that the cost and circuit area can be reduced. In practical applications, since the analog data is maintained in original channel to be operated without being switched to other channels, no high impedance switches is necessary to be disposed at output terminals of the operational amplifying module, so that the circuit area and the power consumption can be largely reduced and the temperature of the driving circuit can be also decreased.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A preferred embodiment of the invention is a driving circuit used in a display apparatus. In fact, the driving circuit in this embodiment is a non-chopper driving circuit and the data transmitted by an input terminal of an operational amplifying module is the same digital data.

Figure 1A:
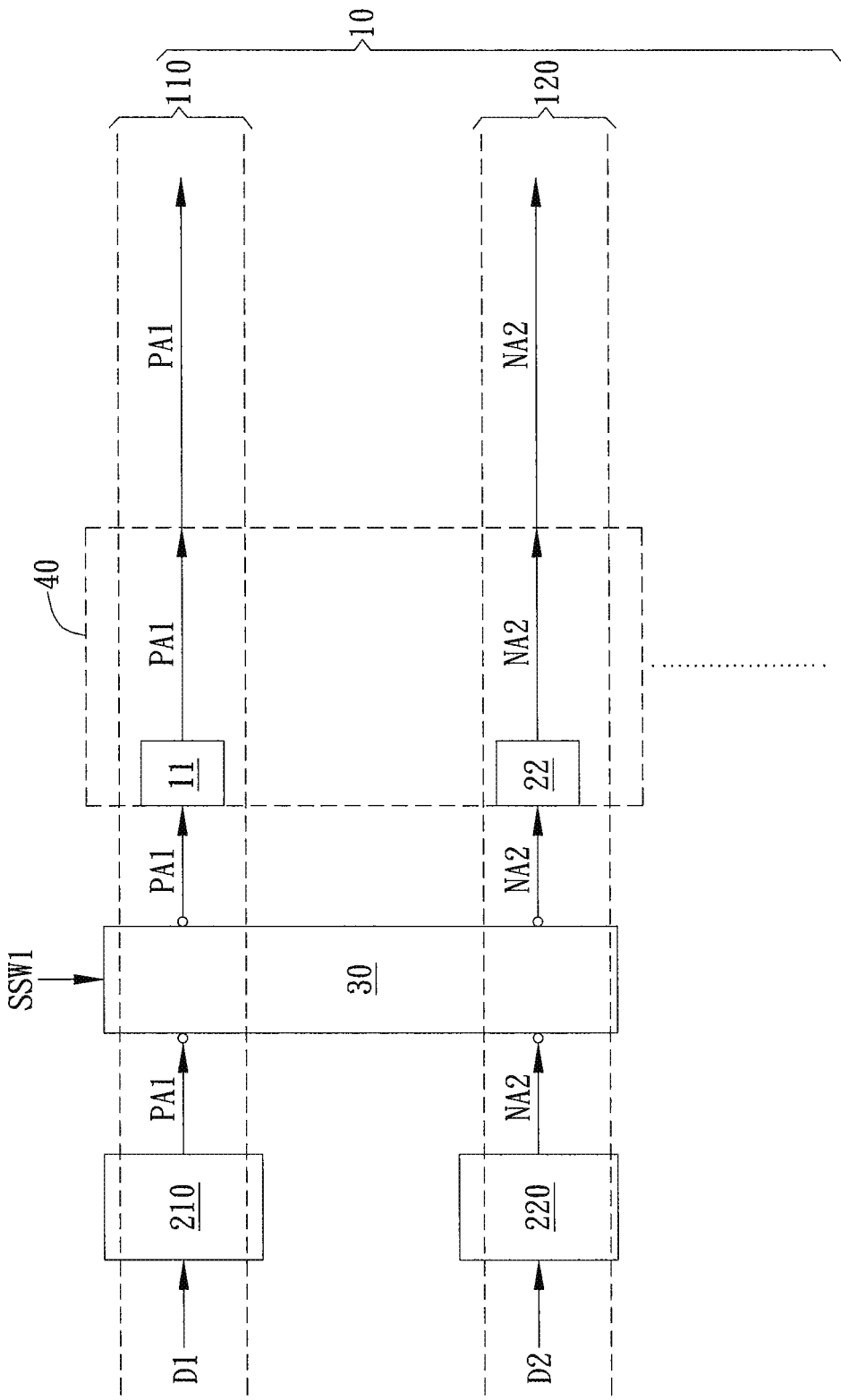
FIG. 1A illustrates a schematic diagram of the first digital data and the second digital data entering into the first channel and the second channel of the driving circuit respectively in an embodiment.
Figure 1B:
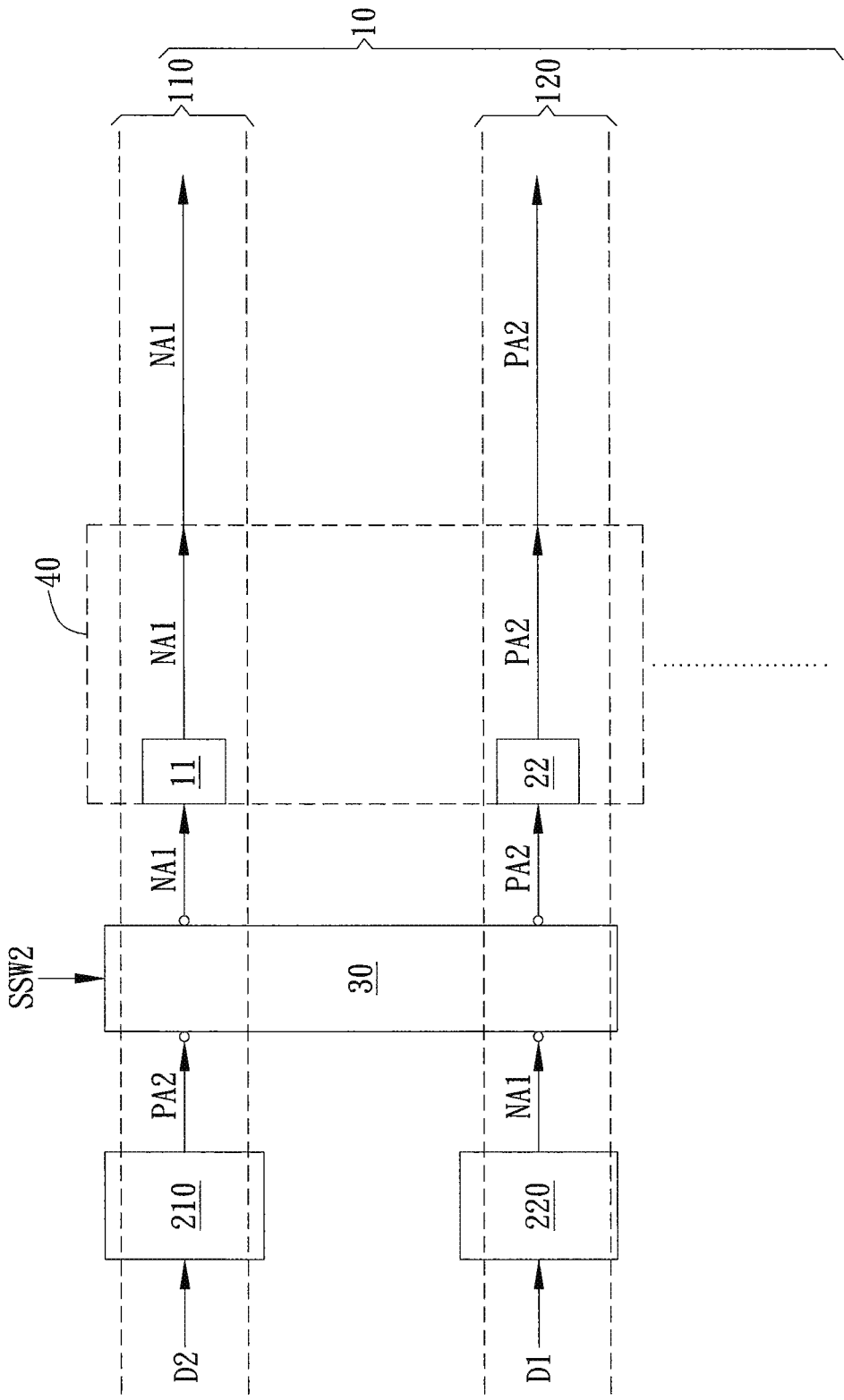
FIG. 1B illustrates a schematic diagram of the second digital data and the first digital data entering into the first channel and the second channel of the driving circuit respectively in the embodiment.

Please refer to FIG. 1A and FIG. 1B. FIG. 1A illustrates a schematic diagram of the first digital data and the second digital data entering into the first channel and the second channel of the driving circuit respectively. FIG. 1B illustrates a schematic diagram of the second digital data and the first digital data entering into the first channel and the second channel of the driving circuit respectively.

As shown in FIG. 1A and FIG. 1B, the driving circuit 1 includes a plurality of channels 10, a positive converting unit 210, a negative converting unit 220, an input switch 30, and an operational amplifying module 40. In fact, the channels 10 include a first channel 110 and a second channel 120. The positive converting unit 210 and the negative converting unit 220 are disposed in the first channel 110 and the second channel 120 respectively. The positive converting unit 210 and the negative converting unit 220 are coupled to the input switch 30; the input switch 30 is coupled to the operational amplifying module 40.

In this embodiment, a first digital data D1 and a second digital data D2 are alternatively transmitted in the first channel 110 and the second channel 120. In fact, the operational voltage of digital data can be a voltage ranging from 2.5V to 3.5V, but not limited to this. As shown in FIG. 1A, the first digital data D1 and the second digital data D2 are transmitted in the first channel 110 and the second channel 120 respectively; on the contrary, as shown in FIG. 1B, the second digital data D2 and the first digital data D1 are transmitted in the first channel 110 and the second channel 120 respectively. In FIG. 1A, the first digital data D1 is transmitted at a front-end of the first channel 110 and the second digital data D2 is transmitted at a front-end of the second channel 120; in FIG. 1B, the second digital data D2 is transmitted at a front-end of the first channel 110 and the first digital data D1 is transmitted at a front-end of the second channel 120.

It should be noticed that the positive converting unit 210 and the negative converting unit 220 are digital-analog converters (DACs). The positive converting unit 210 is used for converting digital data into a positive analog data and the operational voltage of the positive analog data ranges between 8V and 16V; the negative converting unit 220 is used for converting digital data into a negative analog data and the operational voltage of the negative analog data ranges between 0V and 8V, but not limited to this. In other words, the positive converting unit 210 and the negative converting unit 220 convert digital data into high voltage analog data and medium-to-high voltage respectively, and the driving circuit uses high voltage and medium-to-high voltage to drive the display panel.

As shown in FIG. 1A, the positive converting unit 210 and the negative converting unit 220 convert the first digital data D1 and the second digital data D2 into a first positive analog data PA1 and a second negative analog data NA2 respectively.

In addition, the operational amplifying module 40 has a first input terminal 11 and a second input terminal 22, and the first input terminal 11 and the second input terminal 22 are disposed in the first channel 110 and the second channel 120. It should be noticed that after the input switch 30 transmits the positive analog data and the negative analog data to the first input terminal 11 and the second input terminal 22 respectively or to the second input terminal 22 and the first input terminal 11 respectively according to a switch control signal, the positive analog data and the negative analog data will be maintained to be transmitted in the channels of the operational amplifying module respectively.

As shown in FIG. 1A and FIG. 1B, the switch control signal includes a first switch control signal SSW1 and a second switch control signal SSW2, and the input switch 30 determines whether the analog data is transmitted in the original channel or switched to another channel according to the switch control signal. In fact, as shown in FIG. 1A, when the positive converting unit 210 converts the first digital data D1 into the first positive analog data PA1, the input switch 30 transmits the first positive analog data PA1 to the first input terminal 11 according to the first switch control signal SSW1. In addition, when the negative converting unit 220 converts the second digital data D2 into the second negative analog data NA2, the input switch 30 transmits the second negative analog data NA2 to the second input terminal 22 according to the first switch control signal SSW1.

It should be noticed that when the analog data is processed by the operational amplifying module 40, the analog data is maintained in the original channel of the operational amplifying module 40 instead of being switched to another channel. For example, when the first positive analog data PA1 is processed by the operational amplifying module 40, the first positive analog data PA1 is maintained to be transmitted in the first channel 110 instead of being switched to the second channel 120; when the second negative analog data NA2 is processed by the operational amplifying module 40, the second negative analog data NA2 is maintained to be transmitted in the second channel 120 instead of being switched to the first channel 110.

After the first positive analog data PA1 and the second negative analog data NA2 are processed by the operational amplifying module 40 respectively, the first positive analog data PA1 is transmitted in the first channel 110 and the second negative analog data NA2 is transmitted in the second channel 120. In practical applications, since the analog data are maintained to be transmitted in original channel, no switch is necessary to be coupled to the operational amplifying module to switch to other channels, so that the number of the switches can be reduced and the area of the circuit can be also saved. In addition, since the conventional switch is high-impedance switch, power consumption will be high and the circuit temperature will be also increased. On the contrary, since the driving circuit 1 of the invention has no switches, the power consumption can be reduced and the circuit temperature can be also decreased.

As shown in FIG. 1B, the positive converting unit 210 and the negative converting unit 220 convert the second digital data D2 and the first digital data D1 into a second positive analog data PA2 and a first negative analog data NA1 respectively. It should be noticed that when the positive converting unit 210 converts the second digital data D2 into the second positive analog data PA2, the input switch 30 transmits the second positive analog data PA2 to the second input terminal 22 according to the second switch control signal SSW2. In addition, when the negative converting unit 220 converts the first digital data D1 into the first negative analog data NA1, the input switch 30 transmits the first negative analog data NA1 to the first input terminal 11 according to the second switch control signal SSW2.

As shown in FIG. 1A and FIG. 1B, the data received by the first input terminal 11 are the first positive analog data PA1 and the first negative analog data NA1 which are both the analog data converted from the first digital data D1; the data received by the second input terminal 22 are the second positive analog data PA2 and the second negative analog data NA2 which are both the analog data converted from the second digital data D2. Therefore, the driving circuit 1 is a non-chopper driving circuit.

It should be noticed that when the first negative analog data NA1 is processed in the operational amplifying module 40, the first negative analog data NA1 is maintained to be transmitted in the first channel 110 instead of being switched to the second channel 120; when the second positive analog data PA2 is processed in the operational amplifying module 40, the second positive analog data PA2 is maintained to be transmitted in the second channel 120 instead of being switched to the first channel 110.

Further, after the first negative analog data NA1 and the second positive analog data PA2 are processed in the operational amplifying module 40 respectively, the first negative analog data NA1 and the second positive analog data PA2 are maintained to be transmitted in the channels of the operational amplifying module 40, wherein the first negative analog data NA1 is transmitted in the first channel 110 and the second positive analog data PA2 is transmitted in the second channel 120. In other words, the driving circuit 1 does not use the switches to switch the processed analog data to other channels, so that the number of the switches can be effectively reduced and the circuit area can be also saved to reduce power consumption and circuit temperature.

Figure 2A:
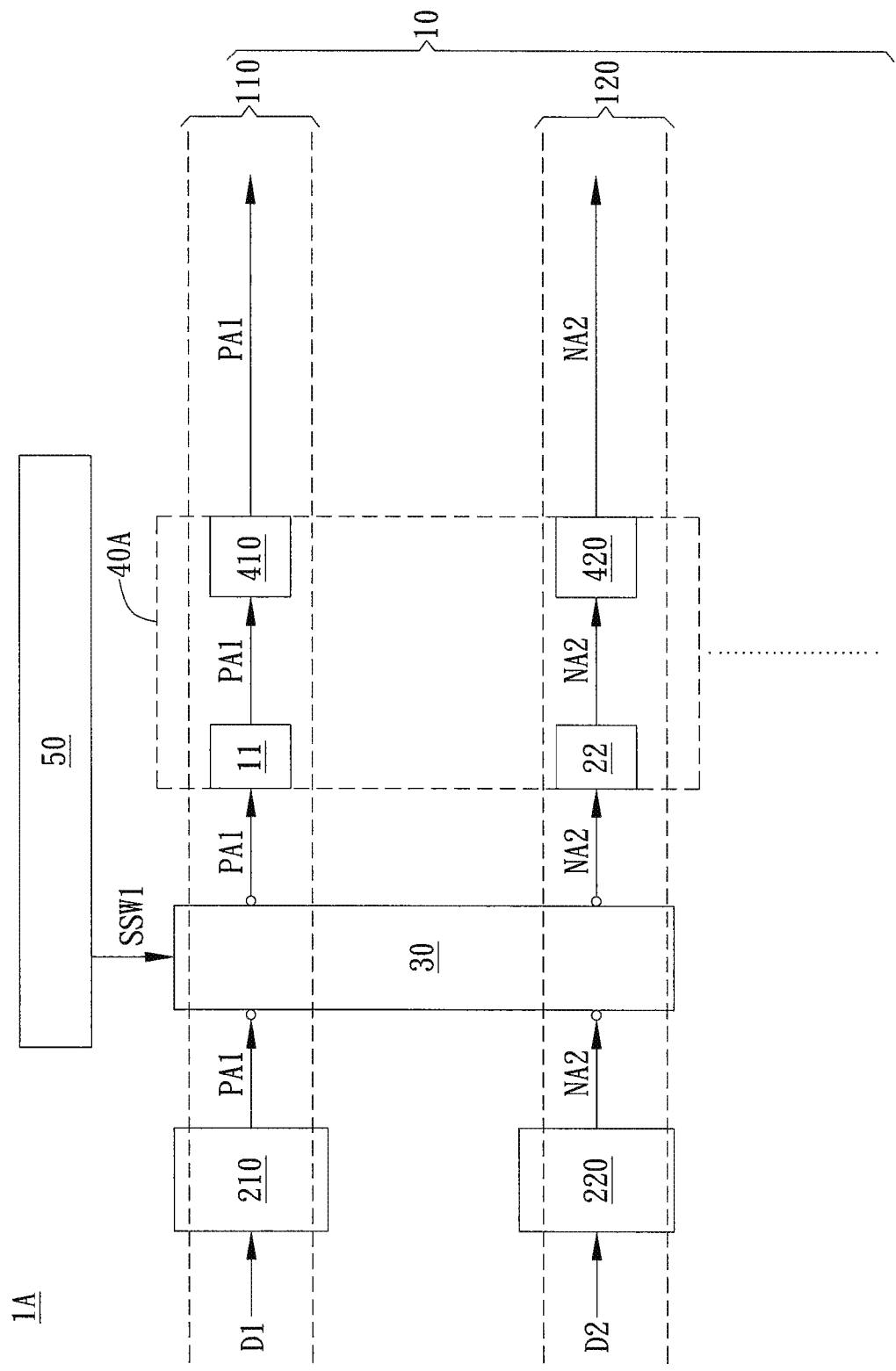
FIG. 2A illustrates a schematic diagram of the first digital data and the second digital data entering into the first channel and the second channel of the driving circuit respectively in another embodiment.
Figure 2B:
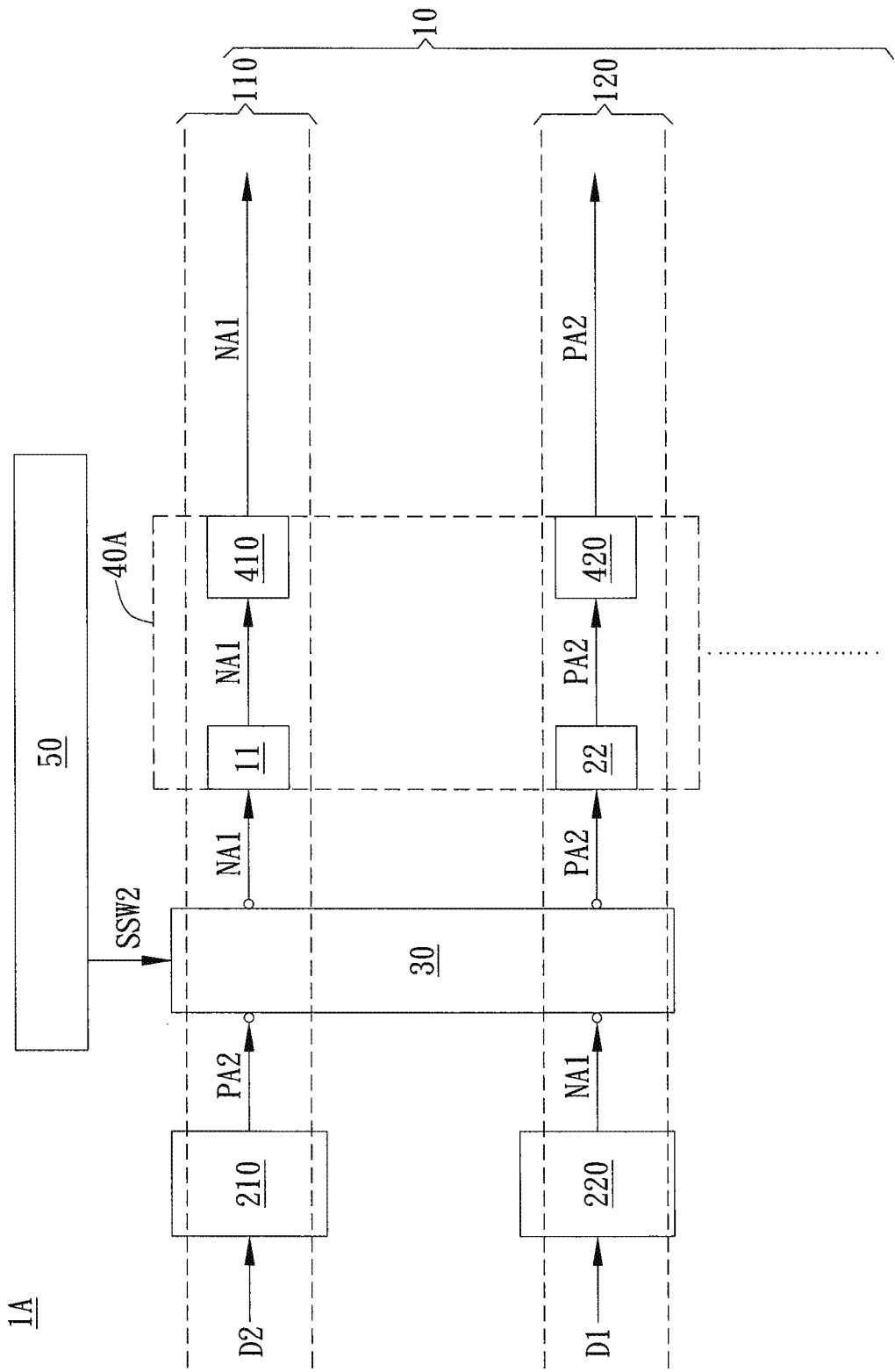
FIG. 2B illustrates a schematic diagram of the second digital data and the first digital data entering into the first channel and the second channel of the driving circuit respectively in the another embodiment.

Please refer to FIG. 2A and FIG. 2B. FIG. 2A illustrates a schematic diagram of the first digital data and the second digital data entering into the first channel and the second channel of the driving circuit respectively. FIG. 2B illustrates a schematic diagram of the second digital data and the first digital data entering into the first channel and the second channel of the driving circuit respectively. Compared to FIG. 1A and FIG. 1B, the driving circuit 1A shown in FIG. 2A and FIG. 2B further includes a control module 50 and the operational amplifying module 40A further includes a first operation unit 410 and a second operation unit 420.

It should be noticed that the control module 50 outputs control signals to the input switch 30 and the operational amplifying module 40A to control the transmission path of the analog data, wherein the control signals include a switching control signal, a positive outputting control signal, and a negative outputting control signal.

In this embodiment, the first operation unit 410 is coupled to the first input terminal 11 and disposed in the first channel 110; the second operation unit 420 is coupled to the second input terminal 22 and disposed in the second channel 120. In practical applications, the driving circuit 1A uses the first operation unit 410 and the second operation unit 420 to process the analog data and then outputs the processed analog data to the display panel.

As shown in FIG. 2A, the first input terminal 11 transmits the first positive analog data PA1 to the first operation unit 410 and the second input terminal 22 transmits the second negative analog data NA2 to the second operation unit 420. The first positive analog data PA1 and the second negative analog data NA2 are maintained to be transmitted in the first channel 110 and the second channel 120 respectively.

In addition, as shown in FIG. 2B, the first input terminal 11 transmits the first negative analog data NA1 to the first operation unit 410 and the second input terminal 22 transmits the second positive analog data PA2 to the second operation unit 420. The first negative analog data NA1 and the second positive analog data PA2 are maintained to be transmitted in the first channel 110 and the second channel 120 respectively.

It should be noticed that the driving circuit 1A uses the control module 50 to output the control signals to control the input switches to determine the transmission paths of the analog data, and the analog data are maintained to be transmitted in the original channels of the operational amplifying module 40A, so that the back-end circuit structure can be simplified to reduce cost.

In this embodiment, the first operation unit 410 and the second operation unit 420 can be operational amplifiers including transistors. The control module 50 generates the control signals to control the transistors to be switched on or off to further process the analog data.

It should be noticed that the driving circuits 1 and 1A use full voltage AVDD to operate the analog data and its operational voltage ranges from 0 to 16V, but not limited to this. In addition, the half voltage AVDD driving circuit is also provided to explain the transmission paths of the analog data.

Figure 3A:
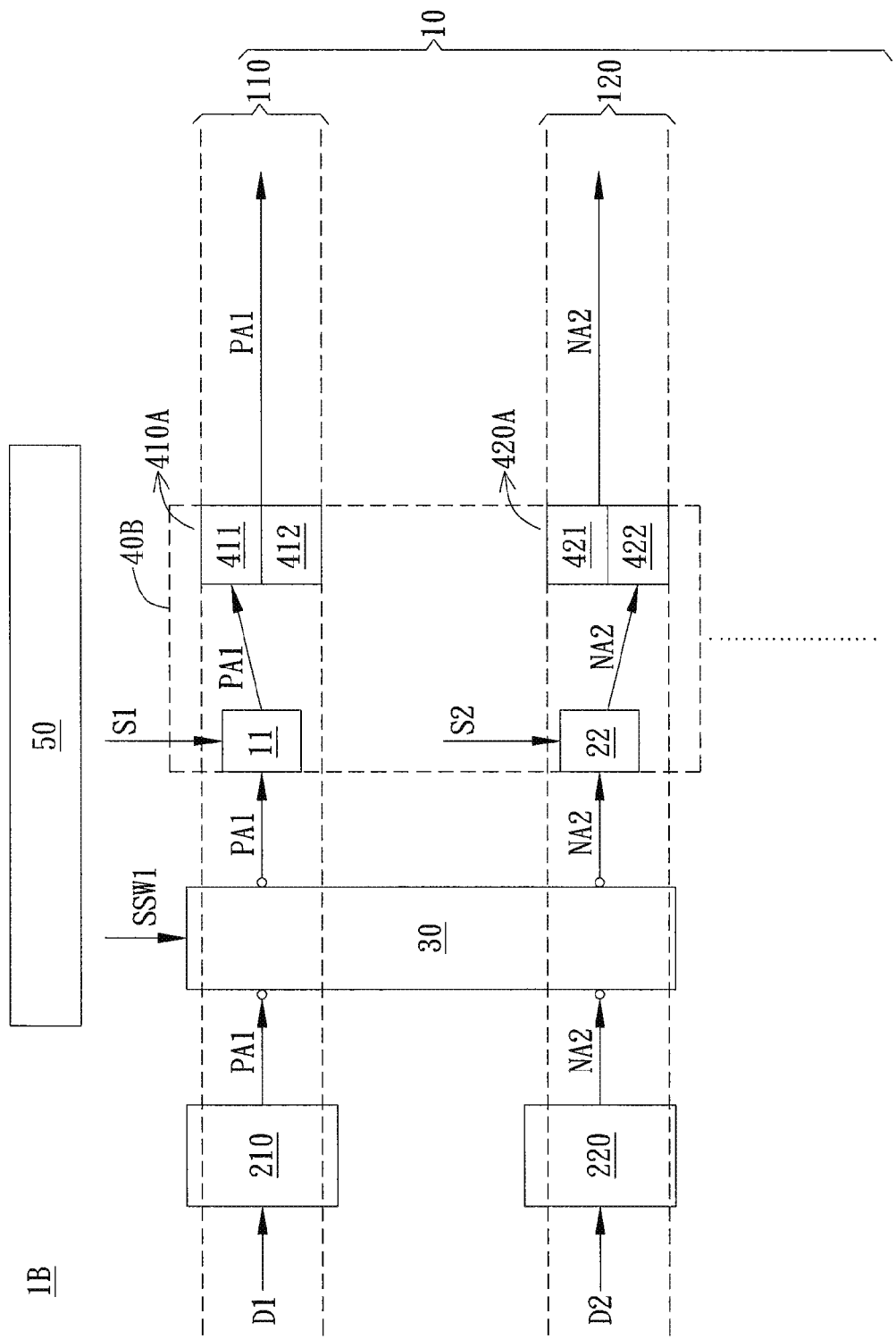
FIG. 3A illustrates a schematic diagram of the first digital data and the second digital data entering into the first channel and the second channel of the driving circuit respectively in another embodiment.
Figure 3B:
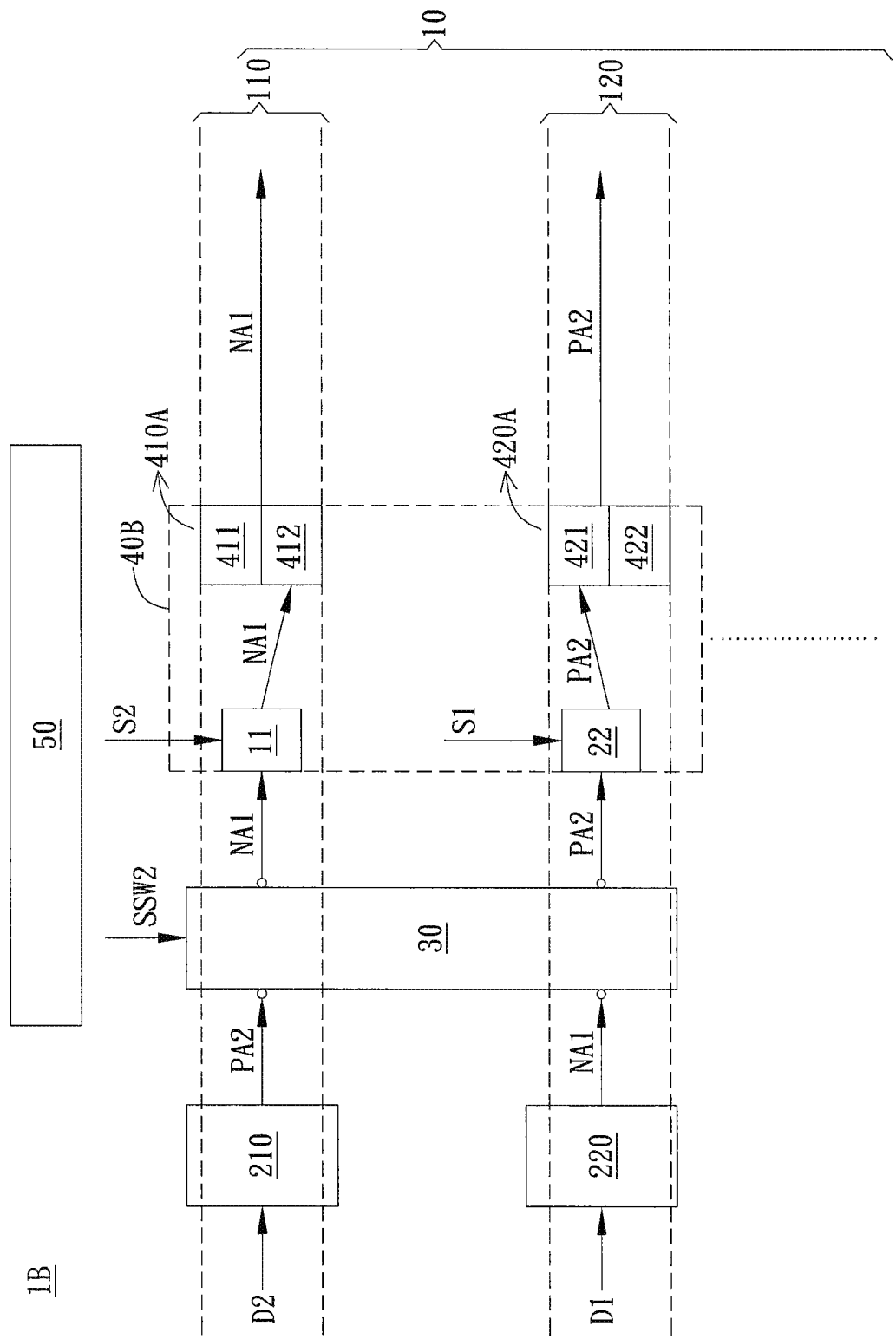
FIG. 3B illustrates a schematic diagram of the second digital data and the first digital data entering into the first channel and the second channel of the driving circuit respectively in the another embodiment.

Please refer to FIG. 3A and FIG. 3B. FIG. 3A illustrates a schematic diagram of the first digital data and the second digital data entering into the first channel and the second channel of the driving circuit respectively. FIG. 3B illustrates a schematic diagram of the second digital data and the first digital data entering into the first channel and the second channel of the driving circuit respectively. Compared to FIG. 2A and FIG. 2B, the driving circuit 1B shown in FIG. 3A and FIG. 3B includes a first operation unit 410A and a second operation unit 420A. The first operation unit 410A includes a first positive outputting unit 411 and a first negative outputting unit 412; the second operation unit 420A includes a second positive outputting unit 421 and a second negative outputting unit 422.

In practical applications, the operational voltage of the first positive outputting unit 411 is twice as the operational voltage of the first negative output unit 412. The operational voltage of the first positive outputting unit 411 ranges from 8V to 16V; the operational voltage of the first negative output unit 412 ranges from 0 to 8V, but not limited to this. Similarly, the operational voltage of the second positive outputting unit 421 is twice as the operational voltage of the second negative output unit 422. The operational voltage of the second positive outputting unit 421 ranges from 8V to 16V; the operational voltage of the second negative output unit 422 ranges from 0 to 8V, but not limited to this. In other words, the first operation unit 410A of the driving circuit 1B uses half voltage AVDD to operate the analog data.

As shown in FIG. 3A, the first input terminal 11 transmits the first positive analog data PA1 to the first positive outputting unit 411 according to a positive outputting control signal S1 and the second input terminal 22 transmits the second negative analog data NA2 to the second negative outputting unit 422 according to a negative outputting control signal S2. It should be noticed that the first positive analog data PA1 and the second negative analog data NA2 are maintained to be processed in the first channel 110 and the second channel 120 respectively instead of being switched to other channels, so that the number of back-end switches can be reduced.

In addition, as shown in FIG. 3B, the first input terminal 11 transmits the first negative analog data NA1 to the first negative outputting unit 412 according to the negative outputting control signal S2 and the second input terminal 22 transmits the second positive analog data PA2 to the second positive outputting unit 421 according to the positive outputting control signal S1. It should be noticed that the first negative analog data NA1 and the second positive analog data PA2 are maintained to be processed in the first channel 110 and the second channel 120 respectively instead of being switched to other channels, so that the number of back-end switches can be reduced.

In this embodiment, he first positive outputting unit 411, the first negative output unit 412, the second positive outputting unit 421, and the second negative outputting unit 422 can be operational amplifiers including transistors. The control module 50 generates the control signals to control the transistors to be switched on or off to further process the analog data.

Figure 4:
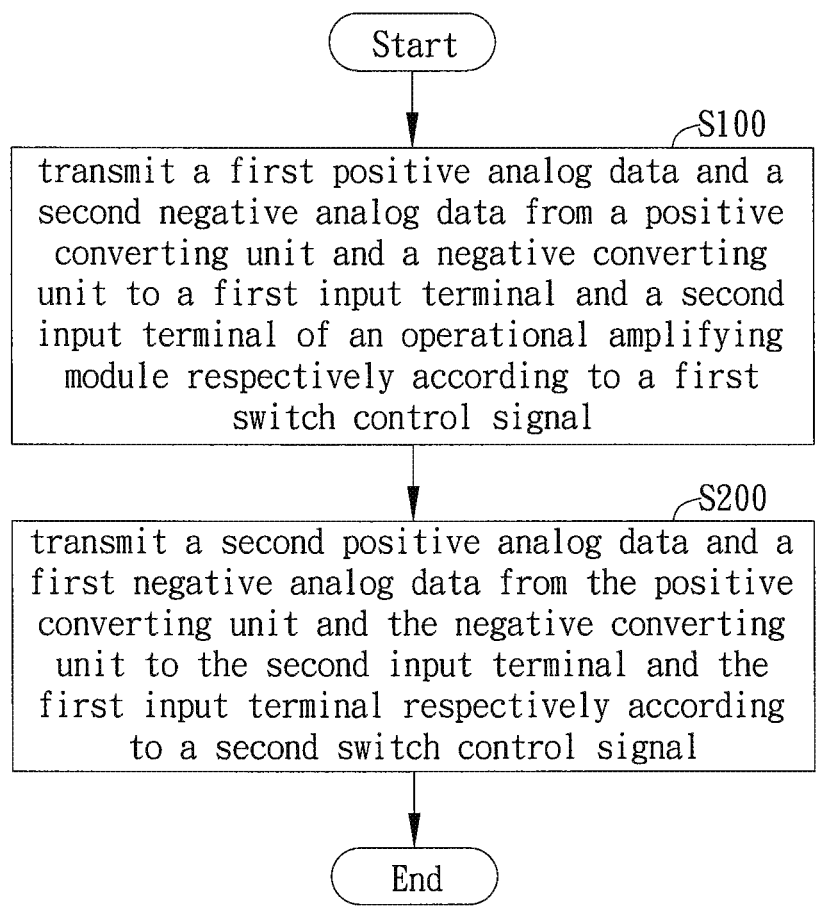
FIG. 4 illustrates a flowchart of the data transmitting method of the invention.

Another embodiment of the invention is a data transmission method used in the driving circuit of the display. Please refer to FIG. 4. FIG. 4 shows a flow chart of the data transmission method in this embodiment.

As shown in FIG. 4, at first, the data transmission method performs the step S100 to transmit a first positive analog data and a second negative analog data from a positive converting unit and a negative converting unit to a first input terminal and a second input terminal of an operational amplifying module respectively according to a first switch control signal. For example, as shown in FIG. 1A, the input switch 30 transmits the first positive analog data PA1 and the second negative analog data NA2 from the positive converting unit 210 and the negative converting unit 220 to the first input terminal 11 and the second input terminal 22 of the operational amplifying module 40 respectively according to the first switch control signal SSW1. In addition, the positive converting unit 210 and the first input terminal 11 are disposed in a first channel 110 and the negative converting unit 220 and the second input terminal 22 are disposed in a second channel 120.

Then, the data transmission method performs the step S200 to transmit a second positive analog data and a first negative analog data from the positive converting unit and the negative converting unit to the second input terminal and the first input terminal respectively according to a second switch control signal. For example, as shown in FIG. 1B, the input switch 30 transmits the second positive analog data PA2 and the first negative analog data NA1 from the positive converting unit 210 and the negative converting unit 220 to the second input terminal 22 and the first input terminal 11 respectively according to the second switch control signal SSW2.

Figure 5:
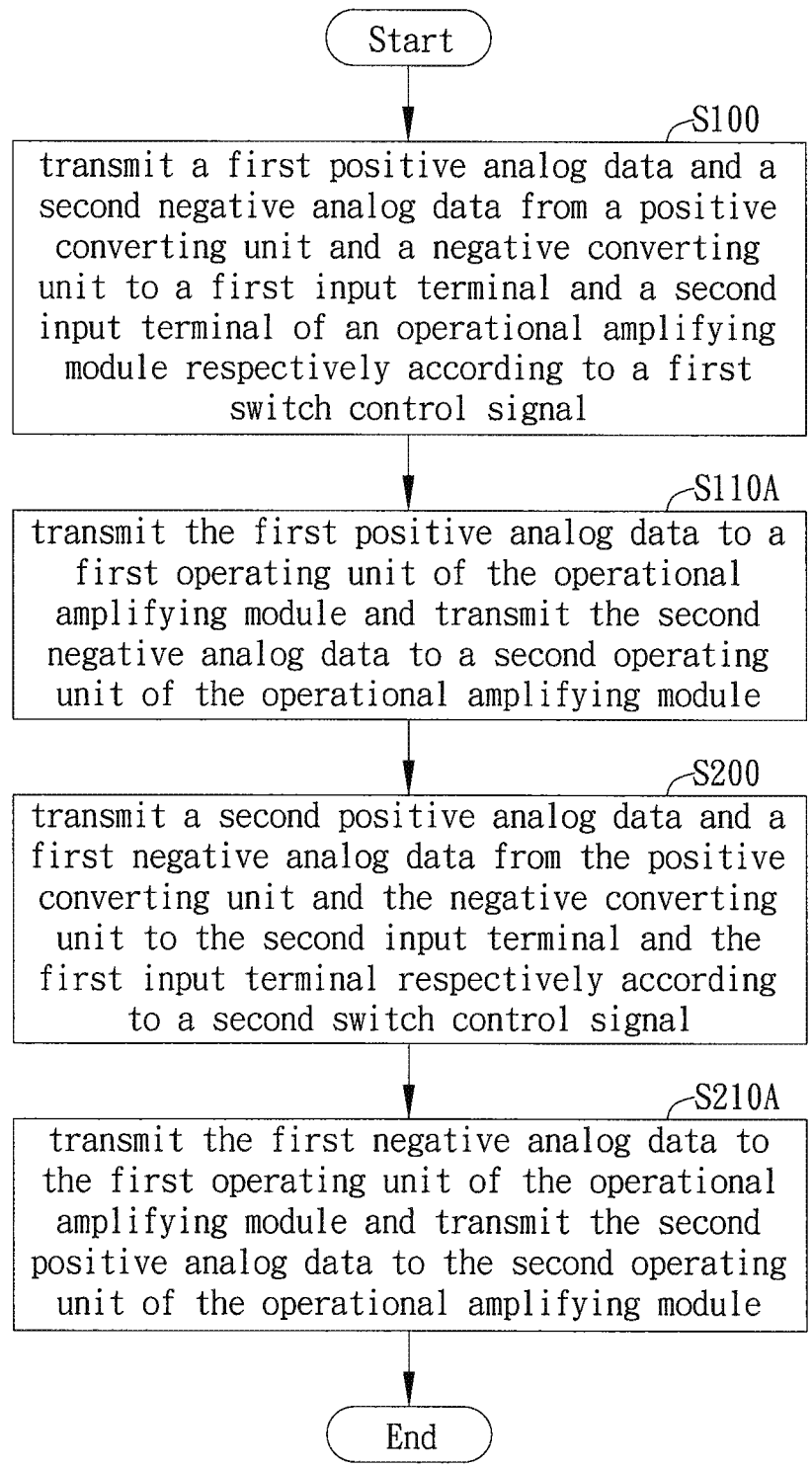
FIG. 5 illustrates another flowchart of the data transmitting method of the invention.

Please refer to FIG. 5. FIG. 5 shows a flow chart of the data transmission method in another embodiment. After the step S100 is performed, the data transmission method further performs the step S110A to transmit the first positive analog data to a first operating unit of the operational amplifying module and transmit the second negative analog data to a second operating unit of the operational amplifying module. For example, as shown in FIG. 2A, the first input terminal 11 transmits the first positive analog data PA1 to the first operating unit 410 of the operational amplifying module 40A and the second input terminal 22 transmits the second negative analog data NA2 to the second operating unit 420 of the operational amplifying module 40A.

In addition, after the step S200 is performed, the data transmission method further performs the step S210A to transmit the first negative analog data to the first operating unit of the operational amplifying module and transmit the second positive analog data to the second operating unit of the operational amplifying module. For example, as shown in FIG. 2B, the first input terminal 11 transmits the first negative analog data NA1 to the first operating unit 410 of the operational amplifying module 40A and the second input terminal 22 transmits the second positive analog data PA2 to the second operating unit 420 of the operational amplifying module 40A.

Figure 6:
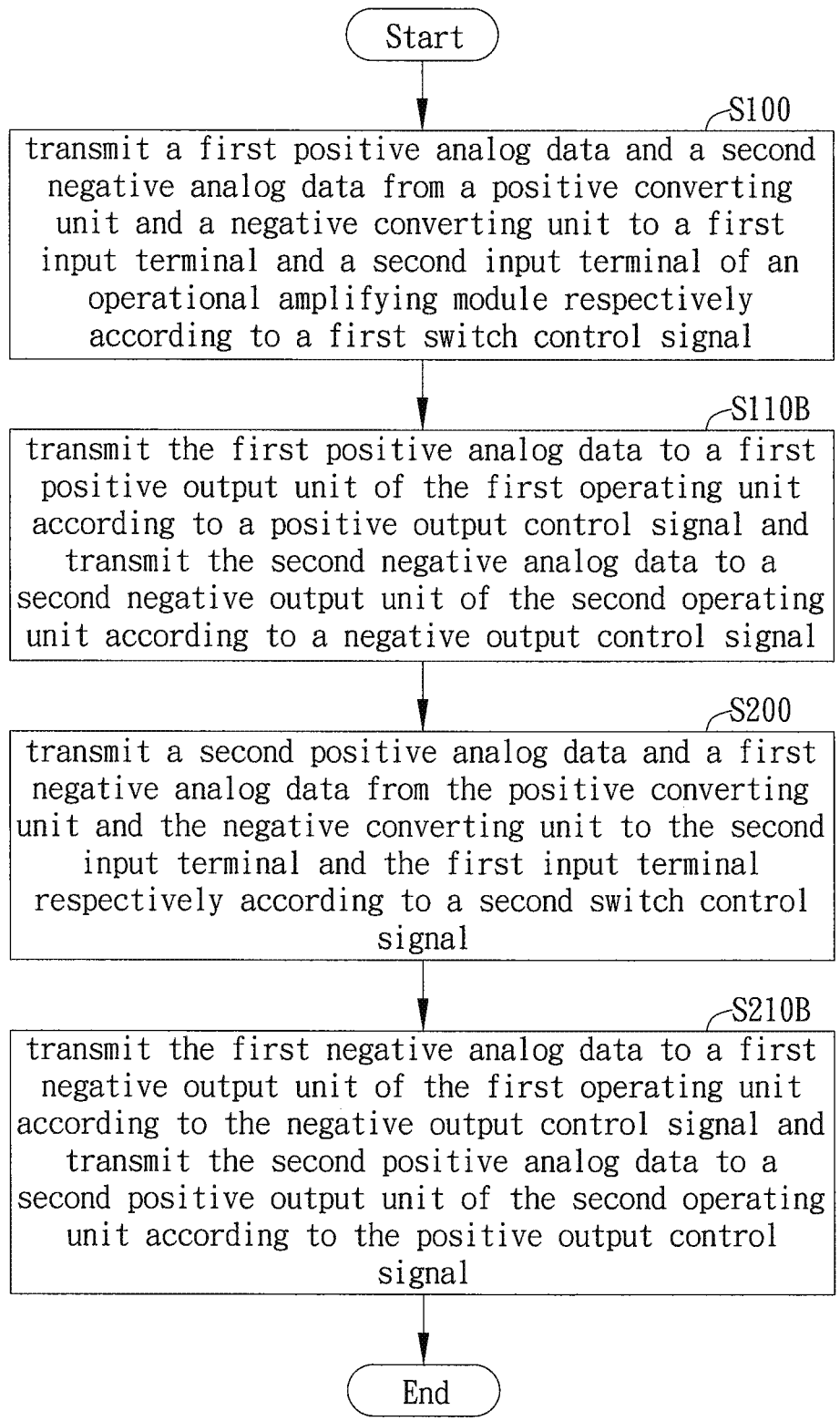
FIG. 6 illustrates another flowchart of the data transmitting method of the invention.

Please refer to FIG. 6. FIG. 6 shows a flow chart of the data transmission method in another embodiment. After the step S100 is performed, the data transmission method further performs the step S110B to transmit the first positive analog data to a first positive output unit of the first operating unit according to a positive output control signal and transmit the second negative analog data to a second negative output unit of the second operating unit according to a negative output control signal. For example, as shown in FIG. 3A, the first input terminal 11 transmits the first positive analog data PA1 to the first positive output unit 411 of the first operating unit 410A according to the positive output control signal S1 and the second input terminal 22 transmits the second negative analog data NA2 to the second negative output unit 422 of the second operating unit 420A according to the negative output control signal S2.

In addition, after the step S200 is performed, the method transmitting method further performs the step S210B to transmit the first negative analog data to a first negative output unit of the first operating unit according to the negative output control signal and transmit the second positive analog data to a second positive output unit of the second operating unit according to the positive output control signal. For example, as shown in FIG. 3B, the first input terminal 11 transmits the first negative analog data NA1 to the first negative output unit 412 of the first operating unit 410A according to the negative output control signal S2 and the second input terminal 22 transmits the second positive analog data PA2 to the second positive output unit 421 of the second operating unit 420A according to the positive output control signal S1.

Compared to the prior art, the driving circuit and data transmitting method of the invention use control signals to control the transmitting path of the analog data to simplify the structure of back-end circuit, so that the cost and circuit area can be reduced. In practical applications, since the analog data is maintained in original channel to be operated without being switched to other channels, no high impedance switches is necessary to be disposed at output terminals of the operational amplifying module, so that the circuit area and the power consumption can be largely reduced and the temperature of the driving circuit can be also decreased.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A driving circuit, comprising:
    a plurality of channels, comprising a first channel and a second channel, wherein a first digital data and a second digital data are alternatively transmitted in the first channel and the second channel;
    a positive converting unit, disposed in the first channel, for converting the first digital data into a positive analog data;
    a negative converting unit, disposed in the second channel, for converting the second digital data into a negative analog data;
    an input switch, coupled to the positive converting unit and the negative converting unit; and
    an operational amplifying module, coupled to the input switch, wherein a first input terminal and a second input terminal of the operational amplifying module are disposed in the first channel and the second channel respectively;
    wherein the input switch transmits the positive analog data and the negative analog data to the first input terminal and the second input terminal respectively or to the second input terminal and the first input terminal respectively accordingly to a switch control signal, the positive analog data and the negative analog data are transmitted in a channel of the plurality of channels corresponding to entering the operational amplifying module.

2. The driving circuit of claim 1, wherein the operational amplifying module comprise:
    a first operating unit, coupled to the first input terminal and disposed in the first channel, for receiving the positive analog data or the negative analog data from the first input terminal; and
    a second operating unit, coupled to the second input terminal and disposed in the second channel, for receiving the positive analog data or the negative analog data from the second input terminal.

3. The driving circuit of claim 2, wherein the first operating unit comprises:
    a first positive output unit, coupled to the first input terminal, for receiving the positive analog data transmitted by the first input terminal according to a positive output control signal; and
    a first negative output unit, coupled to the first input terminal, for receiving the negative analog data transmitted by the first input terminal according to a negative output control signal;
    wherein the operational voltage of the first positive output unit is twice as the operational voltage of the first negative output unit.

4. The driving circuit of claim 2, wherein the second operating unit comprises:
    a second positive output unit, coupled to the second input terminal, for receiving the positive analog data transmitted by the second input terminal according to a positive output control signal; and
    a second negative output unit, coupled to the second input terminal, for receiving the negative analog data transmitted by the second input terminal according to a negative output control signal;
    wherein the operational voltage of the second positive output unit is twice as the operational voltage of the second negative output unit.

5. The driving circuit of claim 3, further comprising:
    a control module, coupled to the input switch and the operational amplifying module, for outputting a plurality of control signals to the input switch and the operational amplifying module, wherein the plurality of control signals comprises the switch control signal, the positive output control signal, and the negative output control signal.

6. The driving circuit of claim 1, wherein the switch control signal comprises a first switch control signal, when the positive converting unit converts the first digital data into a first positive analog data, the input switch transmits the first positive analog data to the first input terminal according to the first switch control signal.

7. The driving circuit of claim 6, wherein the switch control signal further comprises a second switch control signal, when the positive converting unit converts the second digital data into a second positive analog data, the input switch transmits the second positive analog data to the second input terminal according to the second switch control signal.

8. The driving circuit of claim 7, wherein when the negative converting unit converts the first digital data into a first negative analog data, the input switch transmits the first negative analog data to the first input terminal according to the second switch control signal.

9. The driving circuit of claim 8, wherein when the negative converting unit converts the second digital data into a second negative analog data, the input switch transmits the second negative analog data to the second input terminal according to the first switch control signal.

10. A data transmitting method, comprising steps of:
    (a) transmitting a first positive analog data and a second negative analog data from a positive converting unit and a negative converting unit to a first input terminal and a second input terminal of an operational amplifying module respectively according to a first switch control signal, wherein the positive converting unit and the first input terminal are disposed in a first channel and the negative converting unit and the second input terminal are disposed in a second channel; and (b) transmitting a second positive analog data and a first negative analog data from the positive converting unit and the negative converting unit to the second input terminal and the first input terminal respectively according to a second switch control signal.

11. The data transmitting method of claim 10, wherein after the step (a), the method further comprises a step of:
transmitting the first positive analog data to a first operating unit of the operational amplifying module and transmitting the second negative analog data to a second operating unit of the operational amplifying module.

12. The data transmitting method of claim 10, wherein after the step (b), the method further comprises a step of:
transmitting the first negative analog data to a first operating unit of the operational amplifying module and transmitting the second positive analog data to a second operating unit of the operational amplifying module.

13. The data transmitting method of claim 11, wherein after the step (a), the method further comprises a step of:
transmitting the first positive analog data to a first positive output unit of the first operating unit according to a positive output control signal and transmitting the second negative analog data to a second negative output unit of the second operating unit according to a negative output control signal.

14. The data transmitting method of claim 10, wherein after the step (b), the method further comprises a step of:
transmitting the first negative analog data to a first negative output unit of the first operating unit according to a negative output control signal and transmitting the second positive analog data to a second positive output unit of the second operating unit according to a positive output control signal.

15. The driving circuit of claim 4, further comprising:
a control module, coupled to the input switch and the operational amplifying module, for outputting a plurality of control signals to the input switch and the operational amplifying module, wherein the plurality of control signals comprises the switch control signal, the positive output control signal, and the negative output control signal.

* * * * *